US006805754B1

United States Patent
Pokorny et al.

(10) Patent No.: US 6,805,754 B1
(45) Date of Patent: Oct. 19, 2004

(54) DEVICE AND METHOD FOR PROCESSING SUBSTRATES

(75) Inventors: Joachim Pokorny, Hüfingen (DE); Andreas Steinrücke, Talheim (DE)

(73) Assignee: Steag Micro Tech GmbH (DE)

( * ) Notice: Subject to any disclaimer, the term of this patent is extended or adjusted under 35 U.S.C. 154(b) by 0 days.

(21) Appl. No.: 09/869,213

(22) PCT Filed: May 18, 1999

(86) PCT No.: PCT/EP99/08862

§ 371 (c)(1),
(2), (4) Date: Sep. 28, 2001

(87) PCT Pub. No.: WO00/38220

PCT Pub. Date: Jun. 29, 2000

(30) Foreign Application Priority Data

Dec. 22, 1998 (DE) .......................................... 198 59 466

(51) Int. Cl.[7] ................................................ B08B 3/00

(52) U.S. Cl. .................................. 134/36; 134/2; 134/21; 134/34; 134/37; 134/94.1; 134/99.1; 134/103.2; 134/172; 134/198; 134/902; 156/345.15; 156/345.54; 156/345.11; 156/345.17; 156/345.21; 156/345.23; 438/906

(58) Field of Search ................................. 134/2, 21, 34, 134/36, 37, 94.1, 99.1, 103.2, 172, 198, 902, 199; 156/345.15, 345.54, 345.11, 345.17, 345.21, 345.23; 438/906; 216/92

(56) References Cited

U.S. PATENT DOCUMENTS

| | | | | |
|---|---|---|---|---|
| 3,902,513 A | * | 9/1975 | Franz | 134/151 |
| 5,019,205 A | * | 5/1991 | Endl et al. | 156/345.18 |
| 5,351,360 A | * | 10/1994 | Suzuki et al. | 15/302 |
| 5,806,138 A | | 9/1998 | Kawasaki | |
| 5,879,576 A | | 3/1999 | Wada et al. | |
| 5,964,952 A | * | 10/1999 | Kunze-Concewitz | 134/2 |
| 6,059,893 A | * | 5/2000 | Kawasaki | 134/37 |

FOREIGN PATENT DOCUMENTS

| | | |
|---|---|---|
| DE | 2736000 C2 | 3/1978 |
| EP | 0712692 A1 | 5/1996 |
| EP | 10057877 | 3/1998 |
| JP | 62-133097 | 6/1987 |
| JP | 5-109690 | 4/1993 |
| JP | 6-73598 | 3/1994 |
| JP | 7-197299 | 8/1995 |
| WO | WO 97/12079 | 4/1997 |

OTHER PUBLICATIONS

Patent Abstracts of Japan 4–179234 Jun. 25, 1992.

* cited by examiner

Primary Examiner—M. Kornakov
(74) Attorney, Agent, or Firm—R W Becker & Associates; R W Becker

(57) ABSTRACT

A device and method for processing substrates, whereby medium consumption and processing time are reduced. According to the inventive method, liquid is conducted to a surface of the substrate that is to be treated via at least one nozzle that is arranged in a substantially centric position with respect to said substrate and via a plurality of second nozzles that are controlled separately from the first nozzle.

28 Claims, 4 Drawing Sheets

DEVICE AND METHOD FOR PROCESSING SUBSTRATES

This application claims priority of German priority document 198 59 466.6, filed Dec. 22, 1998, the content of which is fully incorporated in the instant application.

BACKGROUND OF THE INVENTION

The present invention relates to a device and method for processing substrates, in particular, semi-conductor wafers. Devices of this type are well known in the relevant technology. It is also known to supply a processing fluid to a semi-conductor wafer via a plurality of nozzles, whereby all of the nozzles are loaded in the same manner with the treatment or processing fluid.

In this regard, however, the problem exists that the consumption of the treatment fluid is relatively large, since, via all of the nozzles, the same volume of treatment is introduced. With additional, outer-lying nozzles, especially in the peripheral region of a wafer, much processing fluid is thereby consumed in an excessive manner. Moreover, the processes used in these devices are relatively slow.

In Japanese Patent JP-6-73 598A, a device for processing a semi-conductor wafer is disclosed having a first nozzle arranged essentially concentrically to the substrate and three nozzles in addition to the first nozzle, which are separately controllable. With this device, a processing fluid is conducted into a processing tank via nozzles located in the bottom of the processing tank, and fed through a lower electrode, having a grid structure, disposed in the processing tank. A substrate to be plated is retained via an upper electrode 3 above the processing tank and the processing fluid is made to overflow from the processing tank, so that the fluid comes into contact with the retained substrate. Between the lower and upper electrodes, a current is applied in order to plate the wafer. During processing, the substrate is uniformly contacted over its entire upper surface from below, and on the wafer the flow is returned in an essentially outwardly directed manner. In the outer area of the substrate, the processing fluid therefore only comes into contact with the substrate for a short time. In the edge regions of the processing tank, the processing fluid flows directly from the processing tank, without previously coming into contact with the substrate.

Therefore, the above process requires much processing fluid. The described processing is, in addition, relatively time consuming due to the outwardly directed flow on the upper surface of the wafer.

In Japanese patent JP 5-109 690 A, a device for processing substrates is described with a processing container which is divided into several zones through concentrically arranged inner walls. The respective zones are supplied with fluid via separate lines. A substrate to be treated is retained by means of a substrate carrier over the processing tank and thereby brought into contact with the treatment fluid, so that the treatment fluid is made to overflow from the processing tank.

European patent WO 97-12079 A1 shows further a device for electroplating substrates with a processing tank that, via a single line, is filled from below with processing fluid. The substrate is held above the processing tank and thereby brought into contact with the processing fluid when the processing fluid is made to overflow the tank. An electrode plate having openings which project at least partially outward is arranged within the processing tank.

The present invention therefore attempts to address the problem of reducing the medium consumption as well as the processing time in treat substrates.

SUMMARY OF THE INVENTION

In contrast to the device disclosed in the "598 patent, the problem is resolved with the present invention by providing a first nozzle which directs the liquid onto the substrate in a radial flow, and second nozzles which are directed transverse to the radial flow. In this regard, the radial flow is guided outwardly in a spiral shaped flow. Through the spiral shaped flow, a longer contact time of the fluid with the substrate is achieved, and therefore a smaller consumption of processing fluid. In addition, a higher dynamic of the processing fluid is provided, whereby the processing time can be reduced.

According to a preferred form of the present invention, the first nozzle is a single point nozzle in order to avoid reciprocating action between various nozzles, therefore making possible an especially uniform fluid layer on the substrate.

For a good, controlled alteration of the liquid flow through the first nozzle, the second nozzles form at least one nozzle group which runs along a prescribed shape or contour, especially a straight line. Preferably, six nozzle groups of this type are provided.

According to a particularly advantageous embodiment of the present invention, the straight lines on which the nozzle groups are constructed project tangentially relative to the first nozzle, that is, the straight lines do not run through the nozzles, rather touch the nozzles' periphery. Through production of a tangential flow of the liquid, specifically, the radially, outwardly flowing fluid layer, which is produced through the first nozzle, the spiral shaped, outwardly directed flow, as described above, can be produced. This effect can also be achieved, for example, through a spiral shaped contour.

In this connection, the second nozzles are directed at the straight line at essentially right angles in order to direct the liquid in a substantially peripheral direction. Preferably, at least one additional nozzle is provided, which is directed back at the first nozzle. In order to produce a good tangential component, the two nozzles are directed at the substrate at an angle of less than 90°, and preferably, at an angle of 45°. Preferably, the second nozzles are point nozzles.

According to a particularly advantageous embodiment of the present invention, the first nozzle and the second nozzles are able to be loaded with different pressures, whereby via the second nozzles, an optimal production of the outward flowing fluid layer can be achieved. Via the conducted fluid volume, the incline or pitch of the spiral shaped, outwardly directed flow, for example, can be changed and thereby, the treatment process can be optimally adjusted.

According to another particularly advantageous embodiment of the present invention, the first nozzle and the second nozzles are able to be loaded with different liquids. The consumption of the processing fluid can be substantially reduced, in that only one processing fluid is conducted via the centered, first nozzle and via the second nozzles, a fluid is conducted which can be adjusted separately from the fluid from the first nozzle.

In a preferred form of the present invention, a rinsing fluid is conducted through the first nozzle for a rinsing process.

For construction of a combination processing/drying device, preferably a vacuum can be applied to the first nozzle. When a processing liquid is first applied onto the substrate via the first nozzle, this processing liquid can adhere droplet-wise on the line leading to the nozzle, or even the nozzle itself. With a subsequent drying, these droplets can leak from the line or the nozzle, which would significantly adversely affect the drying process. A leakage of this type is prevented through a vacuum applied to the first nozzle.

According to a further preferred embodiment of the invention, a gas is conducted via the second nozzles, which allows the flow of the treatment fluid to be optimally adjusted, without changing the properties of the treatment fluid. A further gas fed via the second nozzles can be used for drying the substrate after a previous treatment.

In a further embodiment, the first and second nozzles are arranged in a common base. In order to ensure a good separation of the first nozzle and second nozzles, an insert on the first nozzle is insertable into the base.

For an especially cost-effective and simple embodiment of the present invention, the second nozzles are formed in a nozzle plate of the base and are controlled via a preferably ring-shaped liquid chamber beneath the nozzle plate.

Advantageously, the base has a surface that surrounds the nozzle plate and is lower than the nozzle plate, and which has bores for receiving spacers therein. The spacers serve for adjustment of the spacing of a substrate carrier disposed over the device. Advantageously, the spacers are adjustable.

Accordingly to another preferred embodiment of the present invention, an overflow collar is provided on the base, which makes possible a fluid flow along an outer side of a substrate held in the substrate carrier, especially for drying. In order to provide this fluid flow, at least one inwardly directed nozzle is provided in or on the overflow collar. With one particularly advantageous form of the invention, the nozzle or nozzles in the overflow collar project upwardly, in order to provide the flow through the first and second nozzles. Advantageously, a plurality of nozzles are provided, which are separated by the periphery of the overflow collar, in order to provide a uniform fluid flow on the outer periphery of a substrate carrier.

With a further preferred embodiment of the present invention, at least one outlet is provided in the overflow collar to drain off the treatment fluid from the overflow collar before a drying process of the substrate and/or substrate carrier. Preferably, a tank, which is surrounded by the base, is provided to catch the treatment fluid.

Preferably, the device has a substrate carrier and a unit for conducting a fluid, especially a rinsing fluid in contact with an outer side of a substrate carrier for cleaning purposes.

The above-mentioned problem is also resolved through the method of the present invention for processing substrates, especially semi-conductor wafers, in which a fluid is applied at a right angle onto a surface of a substrate to be treated, via at least one first nozzle arranged substantially concentric to the substrate, so that the fluid applied on the substrate turns around in a radial flow, and a fluid via a plurality of separately controlled second nozzles, transverse to the radial flow, is applied to the surface of the substrate to be treated. This process has the same advantages as the above-described inventive device, in particular, an acceleration of the treatment process and a reduction of consumption of the processing fluid.

Preferred forms of the method are provided in the dependent method claims, in which the same advantages as set forth above are defined.

BRIEF DESCRIPTION OF THE DRAWING

The preferred form of the present invention will be described next with reference to the figures. They show.

DESCRIPTION OF PREFERRED EMBODIMENTS

Figure 1:
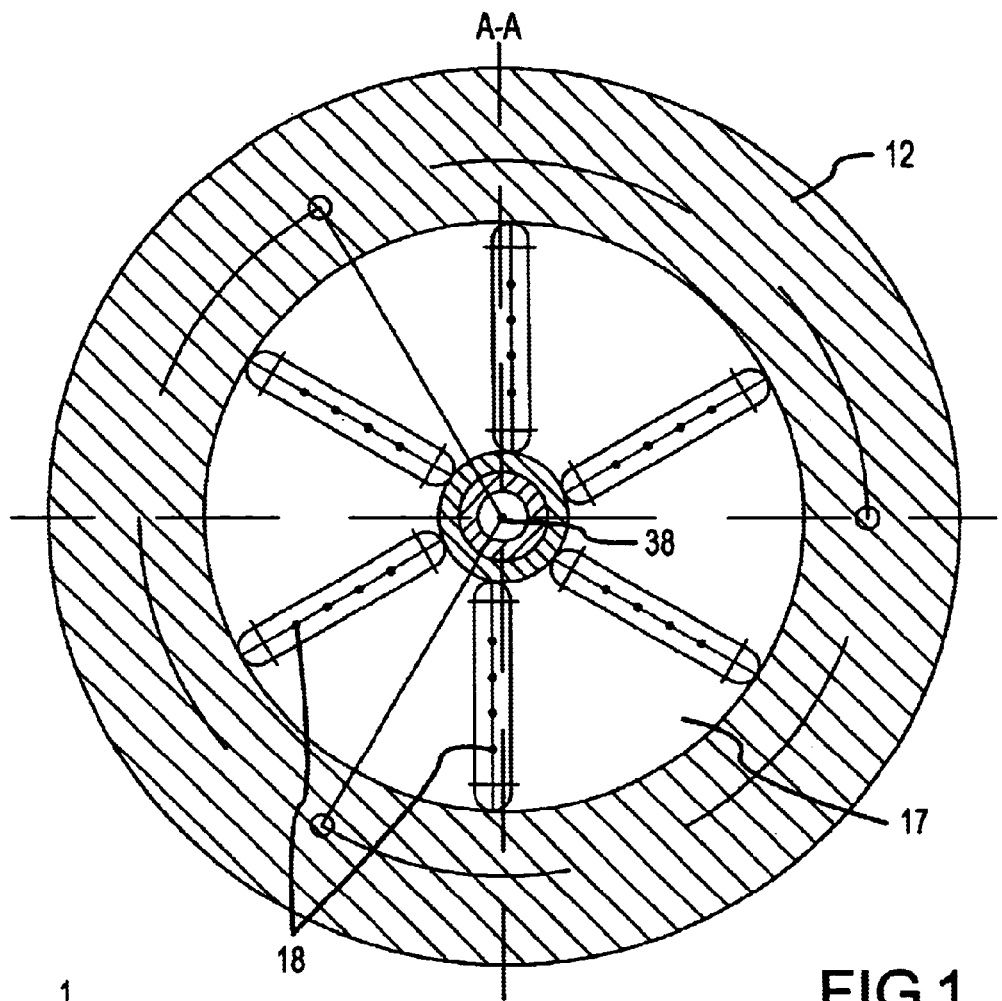
FIG. 1 a schematic sectional view of the processing device of the present invention along the line B—B of FIG. 2.

The invention will be explained first with reference to FIGS. 1 through 4, which show a first embodiment of the invention. FIG. 2 shows a cross sectional view of a rinsing and drying device 1 of the present invention. Above the rinsing and drying device 1, a substrate carrier 3, holding a semi-conductor wafer 2, is disposed. The substrate carrier 3 comprises an upper portion 5 and a ring-shaped lower portion 6, whereby the wafer is clamped between the upper portion 5 and the lower portion 6.

In order to avoid repetition, reference is made to the description of the substrate carrier 3 provided in the application with the application Ser. No. 198 59 467 and the title "Substrate Carrier" filed by the same applicant on the same day as the present application, in so far as the subject matter of the present invention corresponds to this other application.

The rinsing and drying device 1 has a base 10. The base 10 has an annular member 11. On an upper surface of the annular member, three depressions 12 with respective bores are provided. The depressions 12, as well as the bores, receive adjustment screws 13, which project into openings of the lower portion 6 of the substrate carrier 3. Through the adjustment screws 13, the height and alignment of the rinsing and drying device 1 can be adjusted and also changed. Changing the height is advisable, for example, in order to provide for the different spacing and distances used for the drying and rinsing processes. In this regard, it should be noted that a wafer lying on the lower portion 6 of the substrate carrier 3 does not come into contact with other elements of the rinsing and drying device, when the lower portion 6 rests on the adjustment screws 13. Instead of adjustment screws 13, adjustable cylinders, spindles or the like could also be used.

On an inner side of the annular member 11, a flange 14 is formed, whose inner side is aligned with an inner side of the annular member 11. The flange 14 projects upwardly from the annular member 11. An outer transition of the annular member 11 to the flange is round, and the outer side of the flange 14 forms an inwardly directed projection 15 in an upper area. The round transition and the projection 15 form, together with the upper portion 6 of the substrate carrier 3, a substantially uniform flow channel, when the substrate carrier 3 is in the position shown in FIG. 2.

At the upper end of the flange 14, the base 10 has an inwardly projecting nozzle plate 17 disposed substantially perpendicular to the flange 14, in which a plurality of nozzles 18 are formed, as will be described below in greater detail. The nozzle plate 17 has a central opening. In the area of the central opening, a flange 20 is provided which projects perpendicular to and beneath the nozzle plate 17. The flange 20 defines a central opening of the entire base 10.

Between the flange 20, the nozzle plate 17, and an inner side of the flange 14, or the annular member 11, a downwardly opening annular chamber 22 is formed.

A ring-shaped connection plate 25 with openings 26 closes off the lower side of the annular chamber 22. As shown in FIG. 2, the annular member 11 and the flange 20 have recesses facing the annular chamber, which respectively form a shoulder for supporting the connection plate 25. The connection plate 25 is retained on the annular member 11 and the flange 20 by means of welding seams 27 or 28.

In the area of the openings 26 of the connection plate 25, connecting adaptors 30 are welded on, which are connected to the lines (not specifically shown) in order to supply a fluid to the annular processing chamber 22.

An insert 35 with a connecting adaptor 36 is arranged in the central opening formed by the flange 20. The insert 35 can be secured with a welding seam, a screw connection, or other suitable connecting means. An end face 37 of the insert 35 is aligned with an upper side of the nozzle plate 17. In the middle of this end face 37 of the insert 35, a nozzle 38 is provided,-which, while not represented in the figures, is connected with the connecting adaptor 36. The connecting adaptor 36 is connected with a line (not illustrated), in order to lead a rinsing fluid through the nozzle 38 and apply a vacuum to the nozzle 38, as will be described below.

Figure 2:
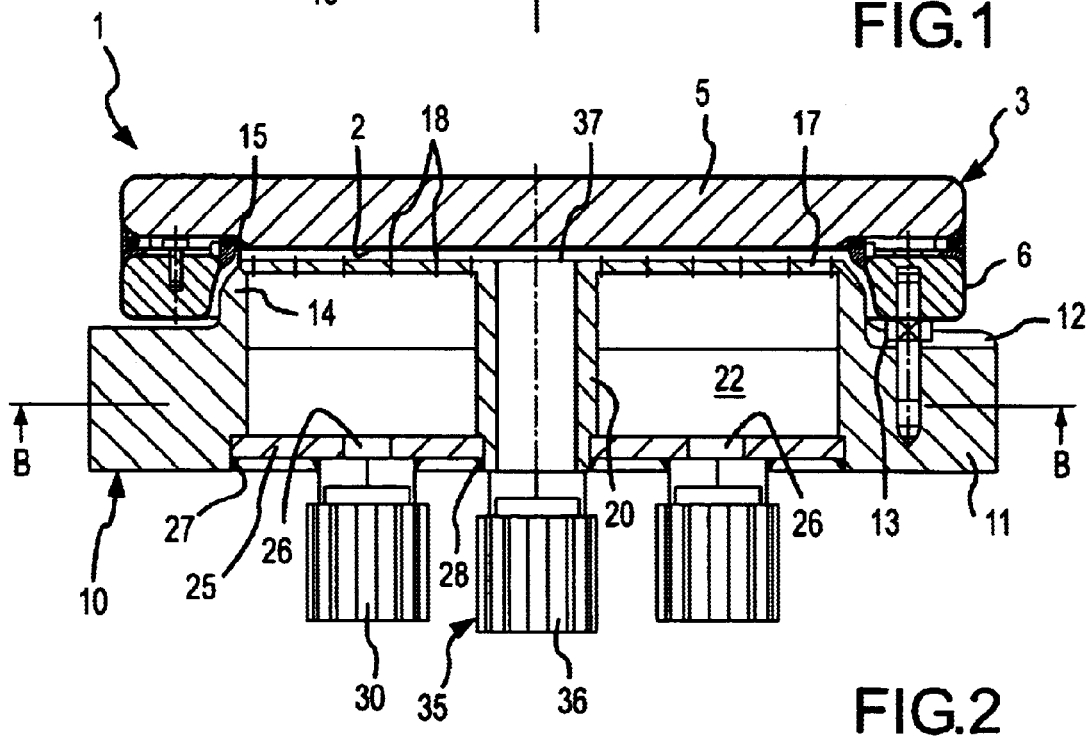
FIG. 2 a cross sectional view of the processing device of the so present invention along the line A—A of FIG. 1.

As best shown in FIG. 1, the nozzles 18 in the nozzle plate 17 are constructed respectively along a straight line, which runs tangential to the center nozzle 38 of the insert 35. Overall, six nozzle groups are provided, which extend along respective straight lines. Each nozzle group has six nozzles. The arrangement and number of the nozzle groups, as well as the nozzles 18 per group, however, can be varied from the represented number shown. For example, the nozzles could be arranged along a bent or other shaped contour.

Also, the spacing of the nozzles shown in FIGS. 1 and 2, in particular, the central nozzle 38 of the insert 35, can be varied. The most radially inner-lying nozzles 18 of the nozzle groups are arranged as close as possible to the central nozzle 38 of the insert 35, although the space in FIG. 1 appears relatively large.

Figure 3:
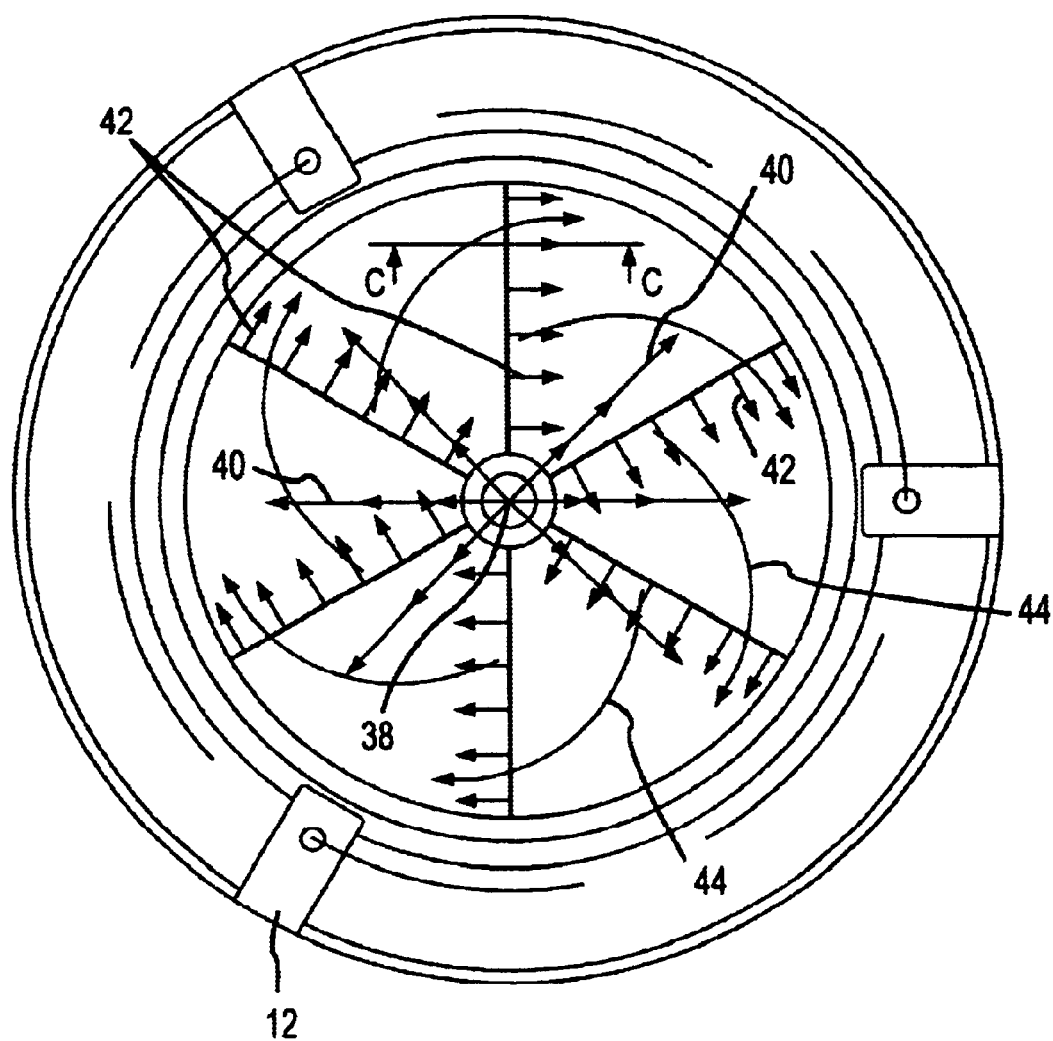
FIG. 3 a schematic plan view of the processing device of the present invention.
Figure 4:
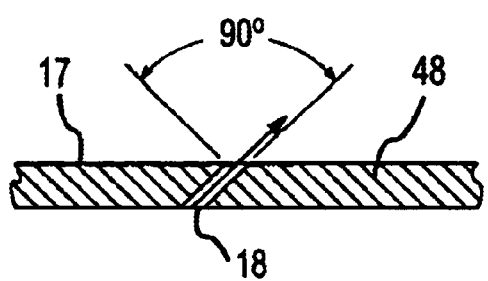
FIG. 4 an enlarged detail view of a cut through a nozzle along the line C—C of FIG. 3.

In FIG. 3, a schematic plan view of the rinsing and drying device 1 of the present invention is represented. In FIG. 3, the flow relationship of the flow through the central nozzle 38 relative to the flow through the nozzles 18 is represented. A uniform, radial, outwardly directed flow comes from the nozzle 38, as represented in FIG. 3 with the arrow 40. A flow directed transverse to the described radial flow comes from the nozzles 18, which is represented by the arrows 42. Through the cooperation of the radial flow 40 with the flow 42 running transversely to the flow 40, a spiral shaped, outwardly running flow is provided, as represented by the arrows 44 in FIG. 3.

In order to produce the flow running transversely to the radial flow, the nozzles 18 are respectively directed at an angle of 90° relative to the straight line along which they are disposed. In addition, the nozzles 18 form an angle of less than 90° relative to an upper surface 48 of the nozzle plate 17, that is, the nozzles 18 lead a fluid flow onto the wafers disposed above at an angle of less than 90°. In the represented embodiment, the angle is 45°. It is also contemplated, however, to choose any other angle that is less than 90° in order to obtain the flow running transverse to the radial flow.

During the operation of the previously described rinsing and drying device 1, the substrate carrier 3 holding the wafer 2 is moved first into a processing position over the device. Subsequently, a rinsing liquid, such as water, is lead via the centrally arranged nozzle 38 onto the semi-conductor wafer 2. The stream is deflected on the wafer 2 at an angle of 90° and forms a uniform, radial outwardly flowing water layer on the wafer 2 (see arrow 40 in FIG. 3). Simultaneously, a gas, such as $N_2$ or CDA (that is, clean, dry air) is lead through the nozzles 18 tangential to the radially flowing water layer (see arrows 42 in FIG. 3). Through the radial flow of the water in cooperation with the tangential flow of the gas, a spiral shaped, outwardly directed flow is produced (see arrows 44 in FIG. 3). Through the gas mixture, the pitch of the spiral construction can be changed and the rinsing process optimally adjusted. An optimization of the rinsing process can also result through an adjustment of the distance between the wafer 2 and the nozzle plate 17.

With a subsequent drying procedure, a vacuum is applied via the connector 36 onto the central nozzle 38. Additionally, gas is conducted through the nozzles 18. A vacuum is applied to the central nozzle 38, so that none of the water drops which have adhered in the lines leak through the nozzle 38. In doing so, the vacuum on the central nozzle 38 is just strong enough to counteract a vacuum which is applied from the outside by the gas flow through the nozzles 18 to the nozzle 38. The vacuum from the interior applied vacuum is not strong enough, however, to operate a substantial flow of the gases ejected from the nozzles 18 to the nozzle 38. The gas flow through the nozzle 18 produces turbulence in the area of the nozzle 38, so that a drying of the overlying substrate also results. Through the flux of the gases and the distance between the substrate 2 and the nozzle plate 17, the drying process can be optimally adjusted. After subsequent drying, the upper portion 5 of the substrate carrier 3 is lifted up in order to grasp and free the wafer 2 from the lower portion 6. In this position, the wafer 2 can be removed from the substrate carrier 3 by a manipulation robot and be replaced by a new, untreated substrate. The substrate carrier 3 is again closed and is ready for a new treatment.

Figure 5:
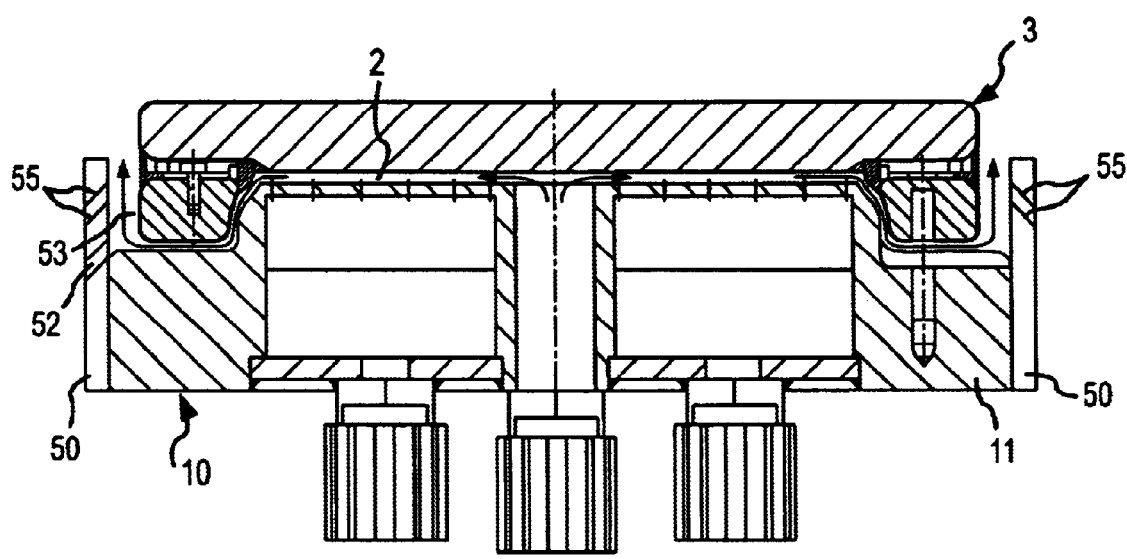
FIG. 5 a cross sectional view similar to FIG. 2 of an alternative embodiment of the present invention.

FIG. 5 shows a further embodiment of the present invention, which is similar to the first described embodiment. In FIG. 5, the same reference numerals are used, to the extent possible, as with the previously described embodiment of FIGS. 1 through 4.

The rinsing and drying device according to FIG. 5 differs from the previously described embodiment in that on an outer edge of the annular element 11, an overflow collar 50 is provided, which can either be formed as one-piece with the annular member 11 or as a separate component, which is connected with the annular member 11 in a suitable manner. In the overflow collar, a controllable outlet 52 is formed for draining off processing fluid.

Between an inner side of the overflow collar 50, an upper side of the annular member 11, and an outer side of the flange 14, an upwardly opening annular chamber is formed into which the lower portion 6 of the substrate carrier 3 can be guided, as shown in FIG. 5. In the position shown in FIG. 5, a flow channel is formed between the substrate carrier and the base 10. This flow channel extends also between an inner side of the overflow collar and an outer side of the substrate carrier, in particular, an outer side of the lower portion 6. Inwardly directed nozzles, which slant upwardly, are provided in the overflow collar 50, through which a fluid, for example a rinsing liquid or a drying gas, can be led to the flow channel between the overflow collar and the substrate carrier. The number and the orientation of the nozzles 55 in the overflow collar 50 can be adjusted accordingly to the respective need. For example, a single, inwardly directed nozzle could be provided. Also, it is not necessary that the nozzles be formed in the overflow collar, since they also can be separately constructed and secured to the overflow collar.

The operation of the rinsing and drying device according to the second embodiment is essentially identical to the operation of the rinsing and drying device of the first embodiment. However, the flow of the rinsing liquid is applied along the outer side of the substrate carrier by the overflow collar 50 when the outlet 52 is closed, in order to likewise clean this outer side, to the extent this is necessary. The upwardly directed flow along the outer side of the substrate carrier is supplemented by a flow produced by the nozzles 55. After the rinsing process, rinsing fluid remaining in the annular chamber 53 first is drained off through the outlet 52. Next, the outlet 52 is again closed and the above-described drying process is initiated, whereby the flow also runs along the outside of the substrate carrier in order to produce a drying effect. The flow along the outside of the substrate carrier and the drying of the substrate carrier is again supplemented by a gas flow flowing through the nozzles 55.

The rinsing and drying device of the first and second embodiments are, respectively, surrounded by a tank or basin (not illustrated) to catch the used rinsing liquid.

Figure 6:
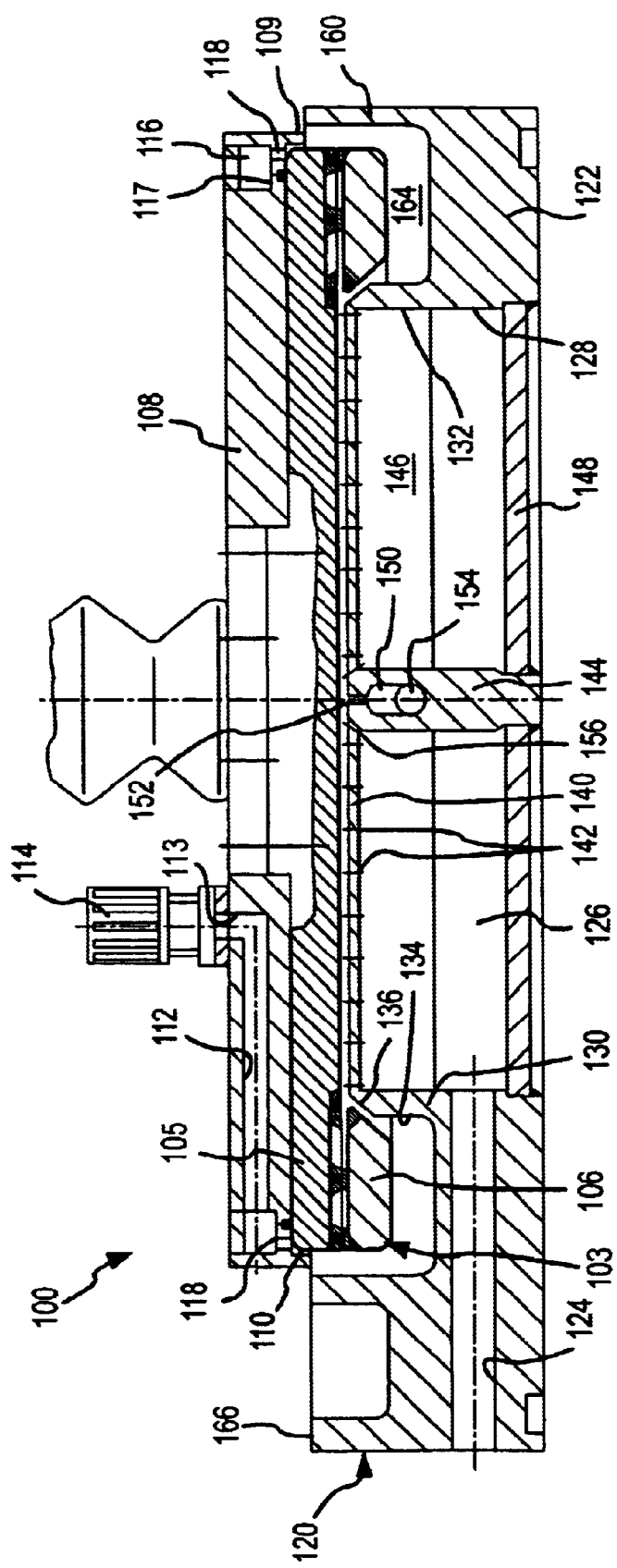
FIG. 6 a cross sectional view of an alternative embodiment of the processing device of the present invention.

FIG. 6 shows a further embodiment of the invention. FIG. 6 shows a cross sectional view of a rinsing and drying device 100 of the present invention. Above the rinsing and drying device 100, a substrate carrier 103, holding a semiconductor wafer, is arranged, whose construction and function essentially corresponds to the substrate carrier 3 of the first embodiment. The substrate carrier 103 comprises an upper portion 105 and a lower portion 106, whereby the wafer is clamped between the upper portion 105 and the lower portion 106.

A body 108 is disposed on the upper portion 105, whose shape matches the shape of the upper portion 105 of the substrate carrier 103, and which has a greater periphery than the upper portion 105. On the outer periphery of the body 108, a downwardly projecting flange 109 is formed, which partially surrounds the upper portion 105, whereby a downwardly opening chamber 110 is formed between the flange 109 and the upper portion 105.

In the body 108, a transverse bore 112 is formed, which is connected in a central region of the body 108 with a vertical bore 113. The vertical bore is connected by a connecting element 114 with a line (not shown), through which a fluid can be conducted into the bore 113 and thereby, the transverse bore 112. The end of the bore 112 remote from the bore 113 is connected with a chamber 116, which extends about the entire body 108, and which has a right-angled cross section. In a floor 117 of the chamber 116, an opening 118 is formed, which connects the chamber 116 with the chamber 110.

Therefore, in operation of the device 100, a fluid, such as a rinsing fluid, can be led via the connector 114 into the body 108, and is then led to the chamber 116 via the bores 113 and 112. Through opening 118, the rinsing liquid then leaks out into the chamber 110, from which it then runs downwardly to clean the outside of the substrate carrier.

The rinsing and drying device 100 further has a base 120. The base 120 has a base portion 122, in which a transverse bore 124 is formed. The base portion 122 has a central opening, which defines an inner periphery 128 of the base portion 122. On an inner side of the base portion 122, a flange 130 is formed, whose inner side 132 is aligned with the inner periphery 128. An outer side 134 of the flange 130 forms an inwardly directed projection 136 in an upper area.

On an upper end of the flange 130, the base 120 has an inwardly extending nozzle plate 140 perpendicular to the flange 130, in which a plurality of nozzles 142 are disposed, as will be described below in greater detail. In a central area of the nozzle plate, a downwardly extending nozzle body 144 is formed as one piece with the nozzle plate 140. Between the inner periphery 128 of the base portion 122 and the inner side 132 of the flange 130 on one side and an outer side of the nozzle body 144 on the other, a downwardly opening annular chamber 146 is formed. The underside of the annular chamber 146 is closed off by a ring-shaped plate 148. As shown in FIG. 6, the base portion 122 and the nozzle body 144 have recesses to the annular chamber, which, respectively, form a shoulder for supporting the plate 148. The plate 148 is welded onto the base portion 122 and the nozzle body 144.

Through the transverse bore 124 of the base portion 122, the annular chamber 146 is connected with a line (not shown), through which a fluid, such as $N_2$, can be conducted into the annular chamber 146.

In the nozzle body 144, a cavity 150 is formed, which is connected with a nozzle 152 disposed above it. The nozzle 152 rests on a central axis of the nozzle plate 140 and is directly perpendicularly upward. The cavity 150 disposed under the nozzle 152 is connected with a line 154 which extends perpendicular to the plane of the drawing, and which is guided through the annular chamber 146 to an outer side of the base 120, although this is not shown in the figures. Through the line 154, the cavity 150, and thereby the nozzle 152, can be loaded with a fluid, for example a rinsing liquid or an etching liquid. As described above with reference to the central nozzle of the first embodiment, a vacuum also can be applied to the nozzle 152.

In the nozzle plate 140, nozzles 142 are provided, as noted above, in a similar manner as the nozzles 18 are arranged in the nozzle plate 17 of the first embodiment. In addition, near the nozzles 142 in the area of the nozzle body 144, inwardly slanted nozzles 156 are provided which are also connected with the annular chamber 146. A fluid flow can be directed via the nozzles 156 in the direction of the central axis, in order to produce an improved flow in this area, in particular upon drying of a substrate disposed above.

On the base portion 122, a further, upwardly extending flange 160 is formed near the flange 130, which essentially corresponds to the overflow collar of the second embodiment shown in FIG. 5. Between the overflow collar 160 and the flange 130, an upwardly opening chamber 164 is formed. The chamber 164 is connected with an outlet (not shown), through which the liquid in the chamber 164 can be drained.

In the area of the transverse bore 124, the base portion 122 is wider, as can be seen on the left side of FIG. 6. In this area, a wider, upwardly extending flange 166 is provided near the flange 160. Between the flanges 160 and 166, an engagement for a swivel arm (not shown) to move the device 100 is formed.

The operation of the rinsing and drying device equates essentially with the above-described operation. However, the liquid level in the chamber 164 is held each time below an upper edge of the flange 160 in order to prevent the liquid from flowing over the flange 160.

During the rinsing of a wafer, an outer side of the substrate carrier 103 is cleaned by rinsing liquid, which is conducted via the body 108 to the outer side of the substrate carrier 103.

During the subsequent drying of the wafer, the rinsing of the outer side of the substrate carrier 103 is discontinued. Further, a vacuum is applied to the central nozzle 152 and, via the nozzles 142 and 156, a flow of a drying gas, such as $N_2$, is directed at the wafer. In this way, a flow directed to the central axis of the nozzle plate is produced via the inwardly slanted nozzles 152. Thus, an improved drying of the wafer portion disposed opposite to the nozzle 152 is achieved.

Although the present invention has been described with reference to the previous embodiments, the invention is not limited to the specialized, represented embodiments. For example, the nozzles 55 in the overflow collar 50, as well as the outlet 52, are not absolutely necessary, since the flow produced by the nozzles 18 and 38 are sufficient to also produce a flow along the outer side of the substrate carrier. Alternatively, an outlet could also be formed in the annular member 11 of the base 10, in order to drain liquid from the annular chamber 53. The device of the present invention is also not limited to the rinsing and drying device, since the device is also suited for any type of substrate processing or treatment, such as, for example, etching treatment with an etching medium, in which a flow must be produced on the substrate's upper surface. The device could also be utilized as a combination etching/rinsing/drying device, with which the respective processes are sequentially performed. Depending on the shape of the substrate, the device can also be used for other shapes than the round shape described herein, and the elements of the device described above, in particular, can be used, respectively, also singularly and independent from one another. These elements are to be viewed, therefore, as independent features.

The specification incorporates by reference the disclosure of German priority document 198 59 466.6 of 22 Dec. 1998 and International priority document PCT/EP99/08862 of 18 May 1999.

The present invention is, of course, in no way restricted to the specific disclosure of the specification and drawings, but also encompasses any modifications within the scope of the appended claims.

What we claim is:

1. An apparatus for processing substrates, comprising:
   a nozzle plate;
   and aligned with an upper surface of said nozzle plate, wherein said at least one first nozzle plate is capable of providing outwardly directed uniform flow over the upper surface of said nozzle plate;
   a plurality of second nozzles disposed in said nozzle plate at an angle of less than 90° relative thereto, wherein said second nozzles and said at least one first nozzle are separately controllable, wherein said second nozzles provide a flow therefrom directed transverse to said radial flow from said at least one first nozzle, and wherein said second nozzles are distributed over the surface of said nozzle plate such that said transverse flow therefrom deflects said radial flow from said at least one first nozzle into a spirally outwardly extending flow.

2. An apparatus according to claim 1, wherein said at least one first nozzle is a single point nozzle.

3. An apparatus according to claim 1, wherein said second nozzles form at least one nozzle group, which extends along a prescribed contour.

4. An apparatus according to claim 3, wherein said prescribed contour extends tangential to said at least one first nozzle.

5. An apparatus according to claim 1, which includes at least one further nozzle, which is disposed between said at least one first nozzle and said second nozzles, and is directed radially toward said at least one first nozzle.

6. An apparatus according to claim 1, wherein said second nozzles are disposed in said nozzle plate at an angle of 45°.

7. An apparatus according to claim 1, wherein said second nozzles are point nozzles.

8. An apparatus according to claim 1, wherein said at least one first nozzle and said second nozzles can operate under different pressures and/or can be supplied with different fluids.

9. An apparatus according to claim 5, wherein a common base is provided for said at least one first nozzle, said second nozzles, and said at least one further nozzle.

10. An apparatus according to claim 9, wherein an insert is integrated perpendicular into said base, and wherein said at least one first nozzle is provided in said insert.

11. An apparatus according to claim 1, wherein an annular fluid chamber is disposed beneath said nozzle plate.

12. An apparatus according to claim 9, wherein said base is provided with a surface that surrounds said nozzle plate and is disposed lower than said nozzle plate, wherein said surface is provided with a plurality of bores for accommodating a corresponding number of spacers.

13. An apparatus according to claim 12, wherein said spacers are adjustable.

14. An apparatus according to claim 9, wherein said base is provided with an overflow collar.

15. An apparatus according to claim 14, wherein said overflow collar is provided with at least one inwardly directed nozzle.

16. An apparatus according to claim 9, wherein a tank is provided that surrounds said base.

17. An apparatus according to claim 1, wherein a substrate carrier is provided for holding a substrate, and wherein a device is provided for conducting a fluid onto an outer side of said substrate carrier.

18. An apparatus according to claim 17, wherein said device is disposed on said substrate carrier.

19. An apparatus according to claim 1, wherein said second nozzles form at least one nozzle group, which is positioned along a straight line.

20. A method of processing substrates, including the steps of:
   providing at least one first nozzle, and a nozzle plate disposed parallel to a substrate fixed on a substrate carrier, wherein said at least one first nozzle is disposed essentially centrally relative to said substrate and aligned with said nozzle plate;
   conducting a fluid, via said at least one first nozzle, at a right angle onto a substrate surface that is to be treated so that fluid striking said substrate is deflected into a radial flow between said substrate and said nozzle plate;
   providing a plurality of second nozzles disposed in said nozzle plate and positioned at an angle of less than 90° relative to the nozzle plate, wherein said second nozzles and the at least one first nozzle are separately controlled;
   conducting a fluid transverse to said radial flow, onto said substrate surface that is to be treated via said plurality of second nozzles, wherein fluid is simultaneously conducted onto said substrate surface by said first and second nozzles; and
   wherein said second nozzles are distributed over the surface of said nozzle plate in such a way that said radial flow is deflected into a spirally outwardly extending flow.

21. A method according to claim 20, wherein said fluid is conducted via said second nozzles onto said surface that is to be treated in essentially a peripheral direction of said substrate.

22. A method according to claim 20, wherein said fluid is conducted onto said substrate surface that is to be treated via said second nozzles at an angle of 45°.

23. A method according to claim 20, wherein fluid is conducted onto said substrate surface that is to be treated via said first and second nozzles at different pressures.

24. A method according to claim 20, wherein different fluids are conducted onto said substrate surface that is to be treated via said first and second nozzles.

25. A method according to claim 20, wherein a rinsing fluid is conducted onto said substrate surface that is to be treated via said at least one first nozzle.

26. A method according to claim 20, wherein a vacuum is applied to said at least one first nozzle.

27. A method according to claim 20, wherein a gas is conducted onto the substrate surface that is to be treated via said second nozzles.

28. A method according to claim 20, wherein an overflow collar having at least one further nozzle is provided, and wherein a fluid is conducted onto an outer surface of the substrate carrier that carries a substrate via said at least one further nozzle.

* * * * *